United States Patent
Lee et al.

(10) Patent No.: US 10,989,399 B2
(45) Date of Patent: Apr. 27, 2021

(54) ELECTROLUMINESCENT LIGHTING DEVICE HAVING TOUCH SENSOR

(71) Applicant: LG Display Co., Ltd., Seoul (KR)

(72) Inventors: Jungeun Lee, Paju-si (KR); JongMin Kim, Paju-si (KR); HwanKeon Lee, Paju-si (KR); Taeok Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/723,845

(22) Filed: Dec. 20, 2019

(65) Prior Publication Data
US 2020/0208822 A1     Jul. 2, 2020

(30) Foreign Application Priority Data
Dec. 31, 2018   (KR) .................. 10-2018-0173307

(51) Int. Cl.
| | | |
|---|---|---|
| *G06F 3/041* | (2006.01) | |
| *F21V 23/04* | (2006.01) | |
| *F21V 9/08* | (2018.01) | |
| *H01L 27/32* | (2006.01) | |
| *H01L 51/52* | (2006.01) | |
| *F21Y 115/20* | (2016.01) | |

(52) U.S. Cl.
CPC ............ *F21V 23/0485* (2013.01); *F21V 9/08* (2013.01); *H01L 27/323* (2013.01); *H01L 51/524* (2013.01); *H01L 51/5253* (2013.01); *F21Y 2115/20* (2016.08); *H01L 2251/5361* (2013.01)

(58) Field of Classification Search
CPC ...... F21Y 2115/20; H05B 33/02; G06F 3/041; H01L 51/52
See application file for complete search history.

(56) References Cited

U.S. PATENT DOCUMENTS

| | | | | | |
|---|---|---|---|---|---|
| 3,310,703 | A | * | 3/1967 | Brooks ................. | H05B 33/22 313/506 |
| 3,317,722 | A | * | 5/1967 | Whitney ............... | H05B 33/26 313/512 |
| 4,060,703 | A | * | 11/1977 | Everett, Jr. ........... | H01H 13/83 200/5 A |
| 4,532,395 | A | * | 7/1985 | Zukowski ............ | H01H 13/702 200/314 |
| 4,683,360 | A | * | 7/1987 | Maser ................... | H01H 13/702 200/314 |
| 5,662,408 | A | * | 9/1997 | Marischen ............. | F21S 8/035 362/253 |
| 5,680,160 | A | * | 10/1997 | LaPointe .............. | H01H 13/702 345/173 |
| 6,621,212 | B1 | * | 9/2003 | Pennaz ................. | H05B 33/04 257/103 |
| 7,186,936 | B2 | * | 3/2007 | Marcus ................. | H01H 13/83 200/310 |
| 7,816,864 | B2 | * | 10/2010 | Liang .................... | H05B 33/28 313/512 |

(Continued)

*Primary Examiner* — Ismael Negron
(74) *Attorney, Agent, or Firm* — Seed Intellectual Property Law Group LLP

(57) ABSTRACT

An electroluminescent light device includes a substrate, an emission element disposed on a first surface of the substrate and defining an emission area, first and second pads disposed on the first surface of the substrate in a non-emission area of the substrate, a touch layer disposed on a second surface of the substrate opposite the first surface, and a cover plate attached on a bottom surface of the touch layer.

10 Claims, 5 Drawing Sheets

(56) References Cited

U.S. PATENT DOCUMENTS

| | | | |
|---|---|---|---|
| 8,110,765 B2* | 2/2012 | Marcus | H01H 13/83 |
| | | | 200/512 |
| 8,237,675 B2* | 8/2012 | Jiang | G06F 3/0412 |
| | | | 345/173 |
| 2017/0198882 A1* | 7/2017 | Wakahara | H01L 51/5268 |

* cited by examiner

ELECTROLUMINESCENT LIGHTING DEVICE HAVING TOUCH SENSOR

CROSS-REFERENCE TO RELATED APPLICATIONS

This application claims the benefit of the Korean Patent Application No. 10-2018-0173307 filed on Dec. 31, 2018, which is hereby incorporated by reference as if fully set forth herein.

BACKGROUND

Technical Field

The present disclosure relates to an electroluminescent lighting device embedding touch function. Especially, the present disclosure relates to an electroluminescent lighting device including an organic light emitting element and a touch layer on the same substrate.

Description of the Related Art

Recently, a series of researches has been actively conducted to use an organic light emitting element as a light source of the lighting device or a display device, based on many advantages and/or merits of an organic light emitting device. For example, a surface light source and/or a point light source applied with the organic light emitting element are applied to the lighting system for the vehicles such as an interior mood lamp, a head lamp, a fog lamp, a retracted lamp, a car light, a number light, a tail lamp, a brake light, a turn signal lamp and so on.

When an organic light emitting element is applied to the lighting device, it is necessary to have a robust structure against the foreign materials such as moisture and oxygen which can penetrate from the outside according to its applied environment. In addition, due to the loss of light amount occurred in the organic light emitting element itself, the luminescent efficiency may be degraded. Therefore, in order to apply the organic light emitting element to the lighting device, it is necessary to develop a structure that protects the element from the external environment and improve the luminescence efficiency and the aperture ratio.

To assemble an apparatus for controlling the lighting device with the lighting device has many demerit for manufacturing the lighting device, and many mechanical problems may be occurred from the assembling structure. In addition, when an additional control pad is assembled to the lighting device, the emission area of the lighting device may be blocked by the control pad. Therefore, it is required to develop a new structure for the electroluminescent lighting device to ensure the maximized emission area by embedding a touch layer into the lighting device for controlling the lighting device.

BRIEF SUMMARY

In various embodiments, the present disclosure provides an electroluminescent lighting device embedding a touch functional element which overcomes or solves various problems, such as those discussed above. In some embodiments, the present disclosure provides an electroluminescent lighting device embedding a touch layer and having a maximized or increased emission area.

In at least one embodiment, the present disclosure provides an electroluminescent lighting device comprising: a substrate including an emission area and a non-emission area surrounding the emission area; an emission element on a first surface of the substrate in the emission area; a first pad and a second pad on the first surface of the substrate in the non-emission area; a touch layer on a second surface of the substrate opposite the first surface; and a cover plate attached on a bottom surface of the touch layer.

In one embodiment, the touch layer includes: a touch electrode including a transparent conductive material and disposed on the second surface of the substrate.

In one embodiment, the touch layer includes: a first touch electrode on the second surface in the non-emission area; an insulation layer covering the first touch electrode; and a second touch electrode overlapping with the first touch electrode on the insulation layer.

In one embodiment, the insulation layer includes at least one of a pigment or a color filter representing a specific color.

In one embodiment, the touch layer is attached to the cover plate with a first optical adhesive layer.

In one embodiment, the touch layer is attached to the second surface of the substrate with a second optical adhesive layer.

In one embodiment, the touch layer is disposed in the non-emission area and the first pad and the second pad overlap the touch layer in the non-emission area.

In one embodiment, the touch layer and the cover plate are attached to the second surface of the substrate with a first optical adhesive layer.

In one embodiment, the electroluminescent lighting device further comprises: a first touch electrode on the second surface of the substrate, the first touch electrode is overlapped by the first pad and the second pad, and the touch layer includes: a film layer; and a second touch electrode on the film layer, and the film layer is disposed between the first touch electrode and the second touch electrode. The touch layer is attached to the cover plate in the non-emission area with a first optical adhesive layer, and the touch layer and the cover plate are attached to the first touch electrode and the substrate with a second optical adhesive layer.

In one embodiment, the electroluminescent lighting device further comprises: an encapsulation layer covering the emission area; a cover film covering the substrate on the encapsulation layer and exposing the first pad and the second pad and an adhesive layer attaching the cover film with the encapsulation layer.

The electroluminescent lighting device according to the present disclosure includes a touch functional layer embedded with the emission element. The electroluminescent lighting device according to the present disclosure does not require an additional space for attaching or assembling an additional apparatus or device for controlling the lighting device. The present disclosure provides a lighting device having a controlling function without any additional process for attaching and/or assembling the controlling apparatus. In addition, embedding a touch layer at the bezel area of the lighting device, the emission area can be ensured to have a maximum area.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
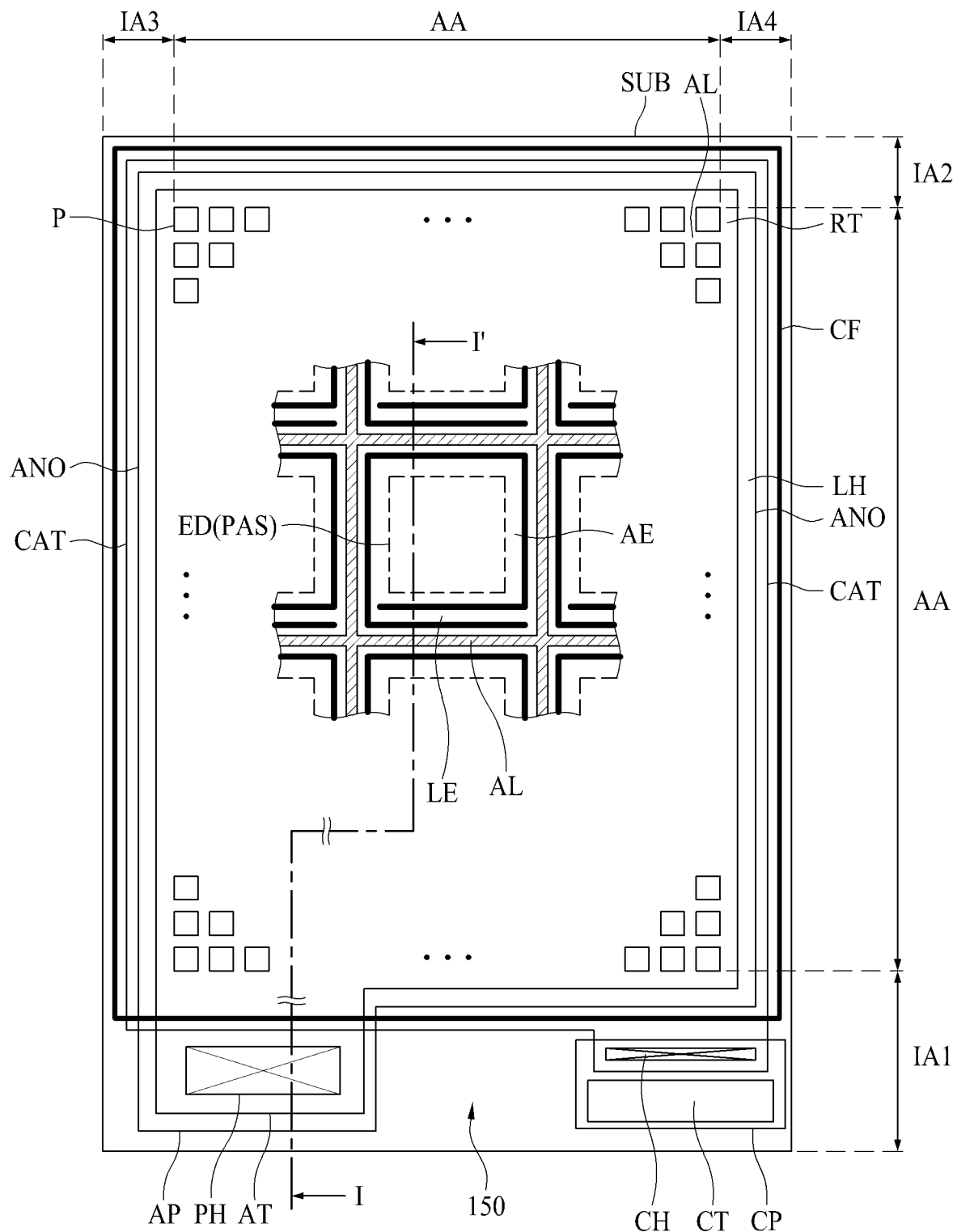
FIG. 1 is a plan view illustrating an electroluminescent lighting device embedded with a touch layer according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

First Embodiment

Figure 2:
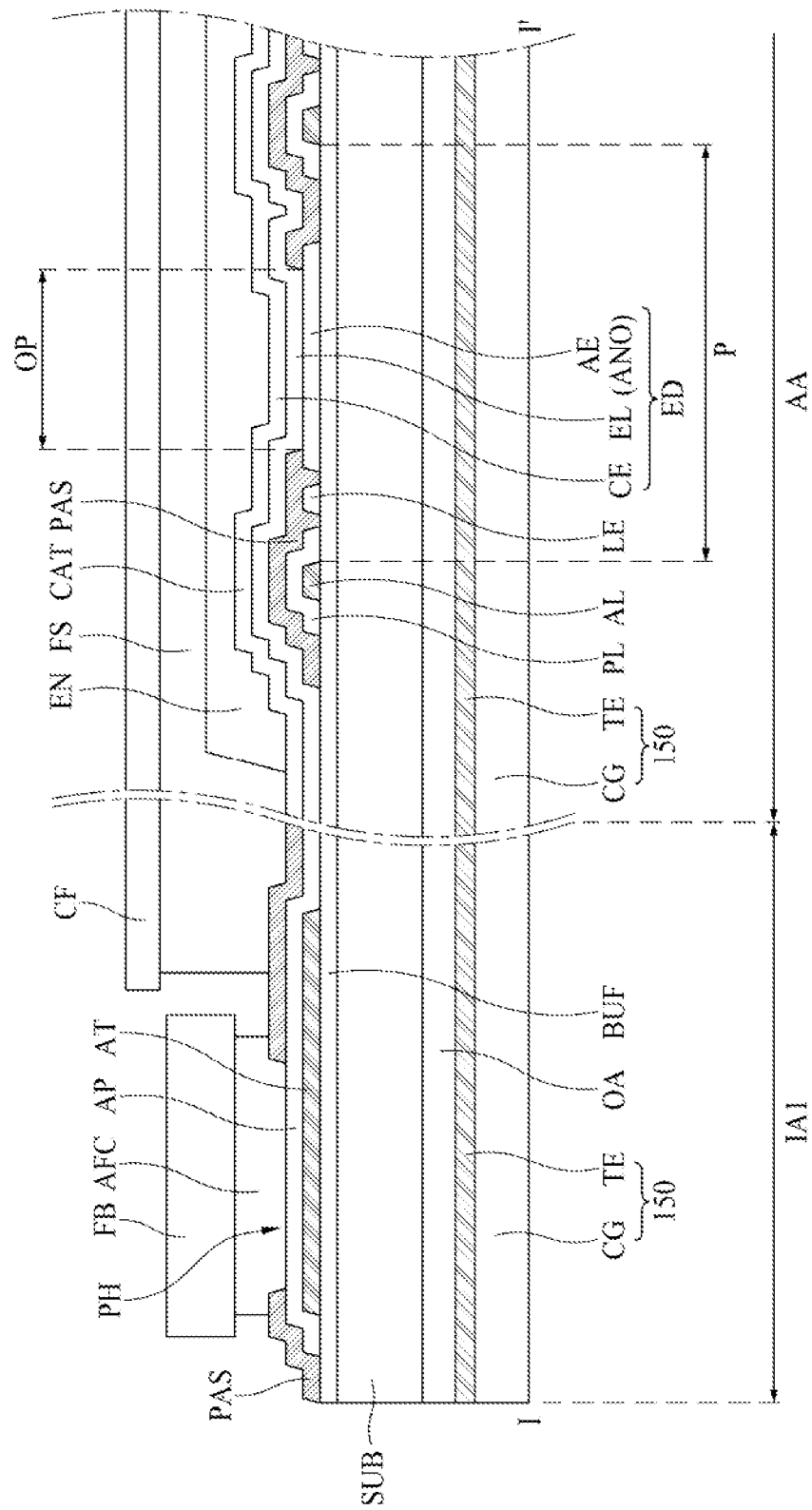
FIG. 2 is a cross-sectional view, taken along the cutting line I-I' of FIG. 1, illustrating a structure of the electroluminescent lighting device embedding a touch layer according to the first embodiment of the present disclosure.

Hereinafter, referring to FIGS. 1 and 2, an electroluminescent lighting device according to the first embodiment of the present disclosure will be explained. FIG. 1 is a plan view illustrating an electroluminescent lighting device embedded with a touch layer according to an embodiment of the present disclosure. FIG. 2 is a cross-sectional view, taken along the cutting line I-I' of FIG. 1, illustrating a structure of the electroluminescent lighting device embedding a touch layer according to the first embodiment of the present disclosure. In this embodiment, the lighting device is an organic luminance lighting device, but it is not limited thereto.

Referring to FIGS. 1 and 2, the electroluminescent lighting device according to the first embodiment of the present disclosure comprises a substrate SUB, a routing line RT, an auxiliary line AL, an anode layer ANO, a cathode layer CAT, an emission element ED, a first pad AP, a second pad CP, a cover film CF and a touch layer 150.

The substrate SUB, as a based substrate (or a base layer), includes a plastic material or a glass material. For example, the substrate SUB may include an opaque or a colored polyimide material. The substrate SUB may include a flexible substrate or a rigid substrate. For example, the flexible substrate SUB may be made of glass material may be a thinned glass substrate having a thickness of 100 micrometer or less, or may be etched glass substrate to have a thickness of 100 micrometer or less.

The lighting device may have various shapes and the properties suitable for the functional purposes. Therefore, it is preferable that the substrate SUB has the characteristics suitable for its function and purpose. For example, the substrate SUB may be formed of an opaque material to provide the lights in only one direction of the substrate SUB, or may be formed of a transparent material to provide the lights in both directions of the substrate SUB. In one example, the substrate SUB, in a plan view, may have a rectangular shape, a rounded rectangular shape in which each corner is rounded with a certain radius of curvature, a non-square shape having at least 5 sides, a circular shape or an elliptical shape. As determining the shape and size of the lighting device, the substrate SUB may have various shapes such as an elongated rectangle, a regular rectangle, a rhombus, and a polygon.

The substrate SUB may include an emission area AA and a non-emission area IA. The emission area AA is disposed in the most middle portions of the substrate SUB which can be defined as an area for emitting the lights. In one example, the emission area AA may have, in a plan view, a rectangular shape, a rounded rectangular shape and non-rectangular shape having at least 5 sides. The emission area AA may have the same shape as the substrate SUB, but is not necessarily. The emission area AA may have the different shape from that of the substrate SUB for the manufacturing purposes and/or the functional requirements.

The non-emission area IA is provided in the circumferential area of the substrate SUB to surround the emission area AA, which may be defined as an area in which light is not provided therefrom. In one example, the non-emission area IA may include a first non-emission area IA1 disposed at the first side of the substrate SUB, a second non-emission area IA2 disposed at the second side parallel to the first non-emission area IA1, a third non-emission area IA3 disposed at the third side perpendicular to the first non-emission area IA1, and a fourth non-emission area IA4 disposed at the fourth side parallel to the third non-emission area IA3. In detail, the first non-emission area IA1 may be set on the upper side (or lower side) of the substrate SUB, the second non-emission area IA2 may be set on the lower side (or upper side) of the substrate SUB, the third non-emission area IA3 may be set on the left side (or right side) of the substrate SUB, and the fourth non-emission area IA4 may be set on the right side (or left side) of the substrate SUB. But it is not restricted thereto.

A buffer layer BUF is disposed on the whole surface of the substrate SUB. The buffer layer BUF is the element for preventing the foreign materials such as moisture or oxygen from intruding into the emission element ED. For example, the buffer layer BUF may include a plurality of inorganic layers in which different inorganic materials are alternately stacked each other. In one example, the buffer layer BUF may include a multiple layers in which two or more inorganic layers of the silicon oxide (SiOx) layer, the silicon nitride (SiNx) layer and the silicon oxy-nitride (SiON) layer are alternately stacked. The buffer layer BUF may have at least two of organic layer and inorganic layer stacked alternately each other.

The auxiliary line AL is formed in the emission area AA. Especially, the auxiliary line AL is disposed in the emission area AA as having a grid pattern or a strip pattern. FIG. 1 shows the case in which the auxiliary line AL is formed as including a plurality of meshes and each of the mesh has the certain open area, but it is not restricted thereto. By the mesh structure of the auxiliary line AL, a single pixel area P may be defined as a grid pattern. In order to keep the power voltage on uniformly being applied over the emission area AA, the auxiliary line AL may have a pattern in which branched lines are disposed with a same interval over the whole surface of the emission area AA.

The auxiliary line AL may be extended to one side of the first non-emission area IA1 to connect with a lower first pad AT. The lower first pad AT may be formed at the same layer and of the same material as the auxiliary line AL. Otherwise, the lower first pad AT may be formed at the different layer and of the different material from the auxiliary line AL. Here, we explain about the case in which the lower first pad AT is formed at the same layer as the auxiliary line AL and is made of the same material as the auxiliary line AL as the one body.

In some cases, a lower second pad CT may be further formed as being separated from the lower first pad AT physically and electrically, and as having an island shape at the opposite side to the lower first pad AT in the first non-emission area IA1. The lower second pad CT may be formed of the same material and at the same layer as the lower first pad AT and the auxiliary line AL. Otherwise, the lower second pad CT may be formed at the different layer and of the different material from the lower first pad AT and the auxiliary line AL. Here, we explain about the case in which the lower second pad CT is made of the same material as the lower first pad AT and the auxiliary line AL and is formed at the same layer as the lower first pad AT and the auxiliary line AL.

The anode layer ANO is deposited on the auxiliary line AL as directly contacting to the auxiliary line AL and covering the whole surface of the emission area AA. As the lighting device shown in FIG. 2 is the bottom emission type, the anode layer ANO may include a transparent conductive material or a semi-transparent conductive material for passing the lights. For example, the anode layer ANO may be made of a transparent conductive material such as indium tin oxide or indium zinc oxide. For another example, the anode layer ANO may include a semi-transparent conductive material such as magnesium (Mg), silver (Ag) or an alloy of magnesium and silver (Mg—Ag).

The anode layer ANO may be disposed some of the non-emission area IA as well as the emission area AA. For example, the anode layer ANO may be formed as covering the lower first pad AT disposed at the first non-emission area IA1. In this case, the anode layer ANO may have the protectional function for the auxiliary line AL and the lower first pad AT. The portions of the anode layer ANO covering the lower first pad AT may be defined as the first pad AP.

The anode layer ANO may be formed as covering the lower second pad CT disposed at the first non-emission area IA1. Especially, the portion of the anode layer ANO covering the lower second pad CT should have an island shape separating from other portions of the anode layer ANO physically and electrically. In that case, the portion of the anode layer ANO covering the lower second pad CT can protect the lower second pad CT. The portion of the anode layer ANO covering the lower second pad CT may be defined as the second pad CP.

Within any one unit pixel P divided by the auxiliary line AL, a power line PL, a link electrode LE and a first electrode AE are formed by patterning the anode layer ANO. The power line PL has a structure in which each power line PL covers the auxiliary line AL and all power lines PL are connected over the emission area AA each other. The first electrode AE has a pattern having polygon shape formed at each unit pixel P. The link electrode LE is a linking portion having a rod or segment shape connecting the first electrode AE to the power line PL. The link electrode LE, as a pathway for supplying the power voltage from the power line PL to the first electrode AE, may play a role of resistance as being patterned as a thin line. For example, when the first electrode AE allocated at any one unit pixel P has the short-circuit problem, the link electrode LE, playing a role of the high resistor, may be broken so that the short-circuit problem may not affect to other unit pixels P.

On the anode layer ANO, a passivation layer PAS is deposited and patterned. In detail, the passivation layer PAS covers the power line PL and the link electrode LE, but exposes most middle area of the first electrode AE. In other words, the passivation layer PAS may define the shape and size of the emission element ED by covering the circumferences of the first electrode AE and exposing the center area of the first electrode AE. The size and the shape of the opened area of the first electrode AE formed in the unit pixel P area may be defined as the open area OP (or emitting area) of the pixel. In this application, "emission area" AA means the area providing the lights over the whole lighting device, the "open area" (or "emitting area") OP means the area providing the lights within one unit pixel P.

It is preferable that the passivation layer PAS is deposited on the non-emission area IA. Especially, the passivation layer PAS may be formed on the first pad AP which is some of the anode layer ANO covering the lower first pad AT extended from the auxiliary line AL. After that, the cathode layer CAT may be stacked thereon. Without passivation layer PAS, the anode layer ANO may be directly contacting the cathode layer CAT so that the short-circuit problem may be occurred. To prevent the short-circuit problem, it is preferable that the passivation layer PAS is disposed on the portions of the anode layer ANO where the cathode layer CAT may be formed later. The first pad AP may be the terminal pad for receiving the electric power voltage, so it may be connected to an external device. Therefore, it is preferable that a pad hole PH may be formed by patterning the passivation layer PAS to expose some area of the first pad AP.

The passivation layer PAS may further cover some portions or all portions of the second pad CP which is some of the anode layer ANO covering the lower second pad CT disposed at the first non-emission area IA1. The second pad CP may be the electric terminal for receiving the common electric voltage. Therefore, it is preferable that the second pad CP is connected to the cathode layer CAT. To do so, the passivation layer PAS may have the cathode hole CH exposing some of the second pad CP.

The emission layer EL may be deposited on the substrate SUB having the passivation layer PAS defining the emission area OP within a single pixel area P. It is preferable that the emission layer EL is formed to have one body of thin layer covering the whole surface of the emission area AA. For an example, the emission layer EL may include at least two emission portions vertically stacked for radiating white color lights. For another example, the emission layer EL may include a first emission portion and a second emission portion for radiating a white light by mixing a first color light and a second color light. Here, the first emission portion may include any one of a blue emission portion, a green emission portion, a red emission portion, a yellow emission portion, and a yellow-green emission portion to emit the first color light. In the interim, the second emission portion may include any one among a blue emission portion, a green emission portion, a red emission portion, a yellow emission portion, and a yellow-green emission portion, to emit the second color light having a complementary relation to the first color light.

The cathode layer CAT may be deposited on the substrate SUB for covering the emission area AA. The cathode layer CAT may be deposited on some of the non-emission area IA as well as the emission area AA. The cathode layer CAT may be formed to cover the same area as the emission area AA or a larger area than the emission area AA. For one example, the cathode layer CAT may extend to the one side of the first non-emission area IA1 so it may be connected the second pad CP through the cathode hole. For another example, the second pad CP may be formed of some portions of the cathode layer CAT only extending to the first non-emission area IA1 without the lower second pad CT and the anode layer ANO covering the lower second pad CT.

The cathode layer CAT may be made of a metal material having superior reflectiveness property. For example, the cathode layer CAT may include a multiple layered structure such as a stacked structure of aluminum and titanium (i.e., Ti/Al/Ti), a stacked structure of aluminum and ITO (indium tin oxide) (i.e., ITO/Al/ITO), an APC alloy (Ag/Pd/Cu), and a stacked structure of APC alloy and ITO (i.e., ITO/APC/ITO). Otherwise, the cathode layer CAT may include a single layered structure having any one material or alloy material of two or more among silver (Ag), aluminum (Al), molybdenum (Mo), gold (au), magnesium (Mg), calcium (Ca) or barium (Ba).

The cathode layer CAT is directly contacted the emission layer EL in face. Therefore, the first electrode AE, the emission layer EL and the cathode layer CAT are sequentially stacked in face within the open area OP or the emission area of the pixel P defined by the passivation layer PAS. The portions of the cathode layer CAT corresponding to the open area OP may be defined as the second electrode CE. That is, the second electrode CE is the portions of the cathode layer CAT corresponding to the open area OP, wherein the cathode layer CAT is stacked on the emission layer EL as being one sheet over the whole area of the emission area AA of the substrate SUB.

The encapsulation layer EN may be stacked on the cathode layer CAT. The encapsulation layer EN is for protecting the emission element ED formed in the emission area AA. The encapsulation layer EN may include a single layered material, or a multiple layered material. In one example, the encapsulation layer EN may include a first inorganic layer, an organic layer on the first inorganic layer, and a second inorganic layer on the organic layer.

The inorganic layers are for preventing the foreign materials such as moisture and oxygen from intruding into the emission element ED. In one example, the inorganic layers may include at least any one of silicon nitride, aluminum nitride, zirconium nitride, titanium nitride, hafnium nitride, tantalum nitride, silicon oxide, aluminum oxide, titanium oxide and so on. The inorganic layers may be formed by the chemical vapor deposition method or the atomic layer deposition method.

In one example, the organic layer may be formed of the organic resin material such as silicon oxycarbide (SiOC), acryl or epoxy. The organic layer may be formed by the coating method such as the inkjet method or the slit coating method.

The encapsulation layer EN may cover all emission area AA, and some of the non-emission area IA. However, it is preferable that the encapsulation layer EN does not cover the first pad AP and the second pad CP to expose them.

On the encapsulation layer EN, a cover film CF may be disposed or attached. The cover film CF may be a thick film including metal material. In order to attach the cover film CF to the encapsulation layer EN, an adhesive FS may be used. It is preferable that the cover film CF is contact in face with the encapsulation layer EN by disposing the adhesive FS on the whole surface of the encapsulation layer EN. The cover film CF may be attached as not covering the first pad AP and the second pad CP but exposing them.

The flexible printed circuit board FB may be attached on the first pad AP exposed by the cover film CF. The flexible printed circuit board FB may include the driver (not shown) for supplying the power voltage, the common voltage and/or the control signals for driving the lighting device. The flexible printed circuit board FB may be electrically connected to the first pad AP through an anisotropic conductive film ACF.

The touch layer 150 may be attached to the lower surface of the substrate SUB by an optical adhesive OA. For example, the touch layer 150 may include a cover glass CG and a touch electrode TE. The cover glass CG may have the same size of the substrate SUB. The touch electrode TE may be formed on the upper surface of the cover glass CG. When the touch electrode TE is made of a transparent conductive material, the touch electrode TE may be formed on the whole surface of the cover glass CG. When the touch electrode TE is made of an opaque metal material, it is preferable that the touch electrode TE may be formed within the first non-emission area IA1 where the first pad AP and the second pad CP are disposed on the substrate SUB. For example, the touch layer 150 including the touch electrode TE may be disposed in the first non-emission area IA1 and may overlapped by the first pad AP and the second pad CP (e.g., the first pad AP and the second pad CP may be positioned overlying the touch layer 150 in the first non-emission area IA1). After that, the upper surface of the touch electrode TE may be attached to the lower surface of the substrate SUB with the optical adhesive there between.

In the first embodiment, the touch electrode may be formed as having one touch layer 150. The touch electrode of the electroluminescent lighting device according to this disclosure may be applied with various types such as the resistance variation sensing type, the capacitance variation sensing type or the force sensing type. For example, for the self-capacitance type, using the touch electrode TE formed with one metal layer as shown in FIG. 2, the lighting device may be turn ON or OFF by touching of user's finger.

In the embodiments hereinafter, the cases in which the touch electrode layer has two layers will be explained. These cases have the structure in which a dielectric layer is inserted between two electrode layers. These cases may be the mutual capacitance type, which may be working as follows. Pressing the touch electrode by finger, the distance between two electrodes will be closer so that the capacitance of the dielectric material there between may be changed. By detecting the variations of the capacitance, the lighting device can be operated by touch of the user.

Second Embodiment

Figure 3:
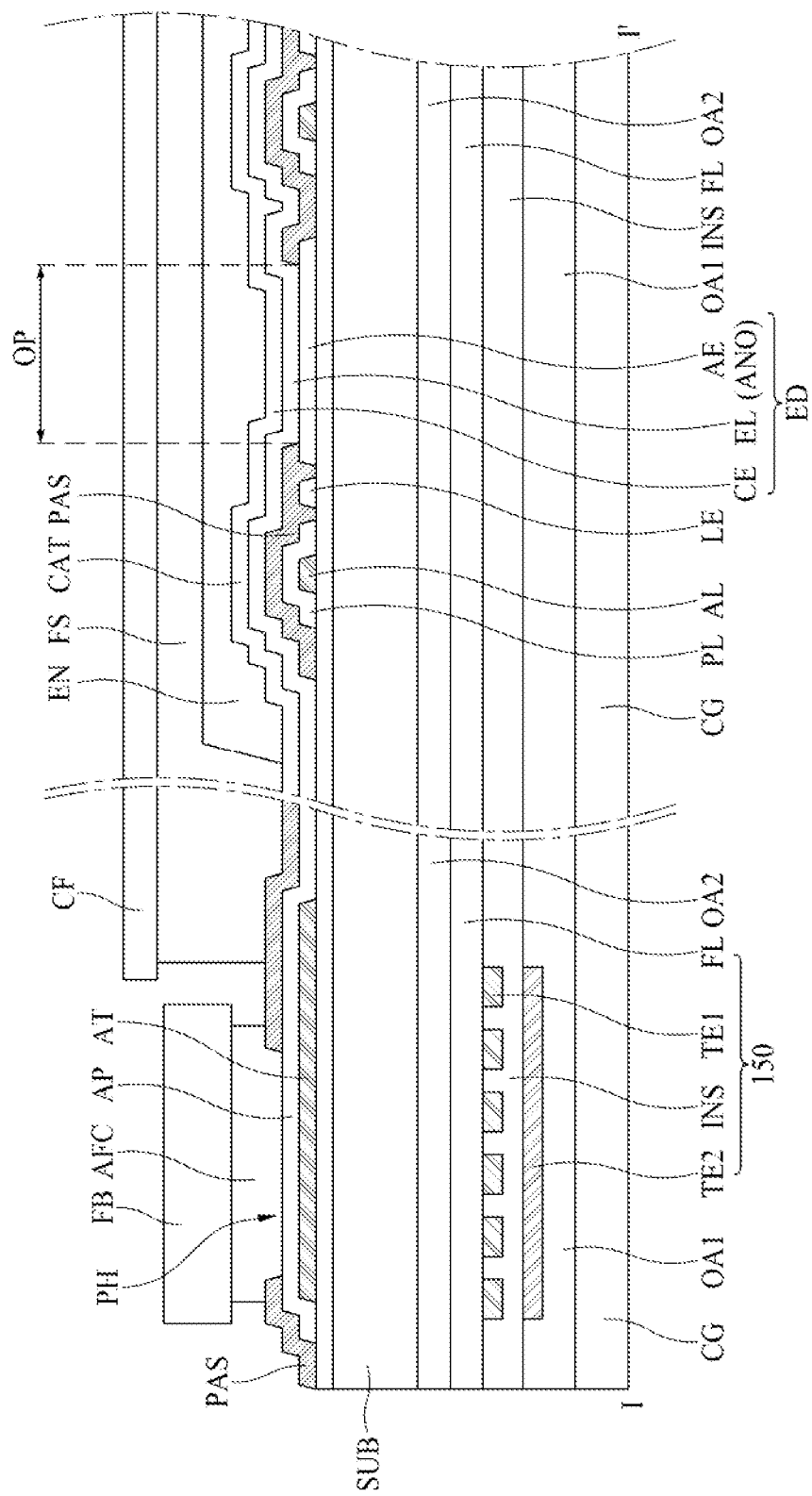
FIG. 3 is a cross-sectional view, taken along the cutting line I-I' of FIG. 1, illustrating a structure of the electroluminescent lighting device embedding a touch layer according to the second embodiment of the present disclosure.

Hereinafter, referring to FIGS. 1 and 3, the second embodiment of the present disclosure will be explained. FIG. 3 is a cross-sectional view, taken along the cutting line I-I' of FIG. 1, illustrating a structure of the electroluminescent lighting device embedding a touch layer according to the second embodiment of the present disclosure.

Referring to FIG. 3, the electroluminescent lighting device embedding a touch layer according to the second embodiment of the present disclosure comprises a substrate SUB, a routing line RT, an auxiliary line AL, an anode layer ANO, a cathode layer CAT, an emission element ED, a first pad AP, a second pad CP, a cover film CF and a touch layer 150. Basically, the structure of the electroluminescent lighting device embedding a touch layer according to the second embodiment is the same as that of the first embodiment. The difference is the detailed configuration and the position of the touch layer 150. Hereinafter, the most important differences will be explained. For the numerical references not mentioned hereinafter, refer to the first embodiment and FIG. 2.

The touch layer 150 according to the second embodiment may include a film substrate FL, a first touch electrode TE1, an insulating layer INS and a second touch electrode TE2. There may be various methods for forming the touch layer 150 according to the second embodiment, one representative method will be explained as below.

The film substrate FL having the shape and size corresponding to the substrate SUB may be prepared. As shown in FIG. 3, the first touch electrode TE1 may be formed on the bottom surface of the film substrate FL. Here, it is preferable that the first touch electrode TE1 is formed at the area corresponding to the first non-emission area IA1. The insulating layer INS is deposited on the whole area of the bottom surface of the film substrate FL having the first touch electrode TEL On the insulating layer INS, the second touch electrode TE2 is formed. It is preferable that the second touch electrode TE2 is also formed at the area corresponding to the first non-emission area IA1.

By applying the first optical adhesive OA1 on the bottom surfaces of the film substrate FL having the second touch electrode TE2 and the insulating layer INS, the film substrate FL is attached to a cover plate, such as the cover glass CG. In this way, the touch layer 150 may be attached to the cover plate or cover glass CG by the first optical adhesive layer OA1. After that, by applying the second optical adhesive OA2 on the whole area of the upper surface of the film substrate FL, the film substrate FL is attached to the substrate SUB. For example, the structure including the touch layer 150, which is attached to the cover glass CG by the first optical adhesive OA1, may be attached to the bottom surface of the substrate SUB.

The electroluminescent lighting device embedding a touch layer according to the second embodiment of the present disclosure has two touch electrodes. In this structure, by pressing or touching the cover glass CG at the area where the first touch electrode TE1 and the second touch electrode TE2 are disposed, the capacitance at the insulating layer INS inserted between the first touch electrode TE1 and the second touch electrode TE2 may be changed. This changed capacitance can be detected through the second touch electrode TE2. By this mechanism, the position where the touch is performed can be determined. With a program by which various mechanical function are operated according to the touch positions, the lighting device can be controlled in different conditions or as performing with various operations.

Third Embodiment

Figure 4:
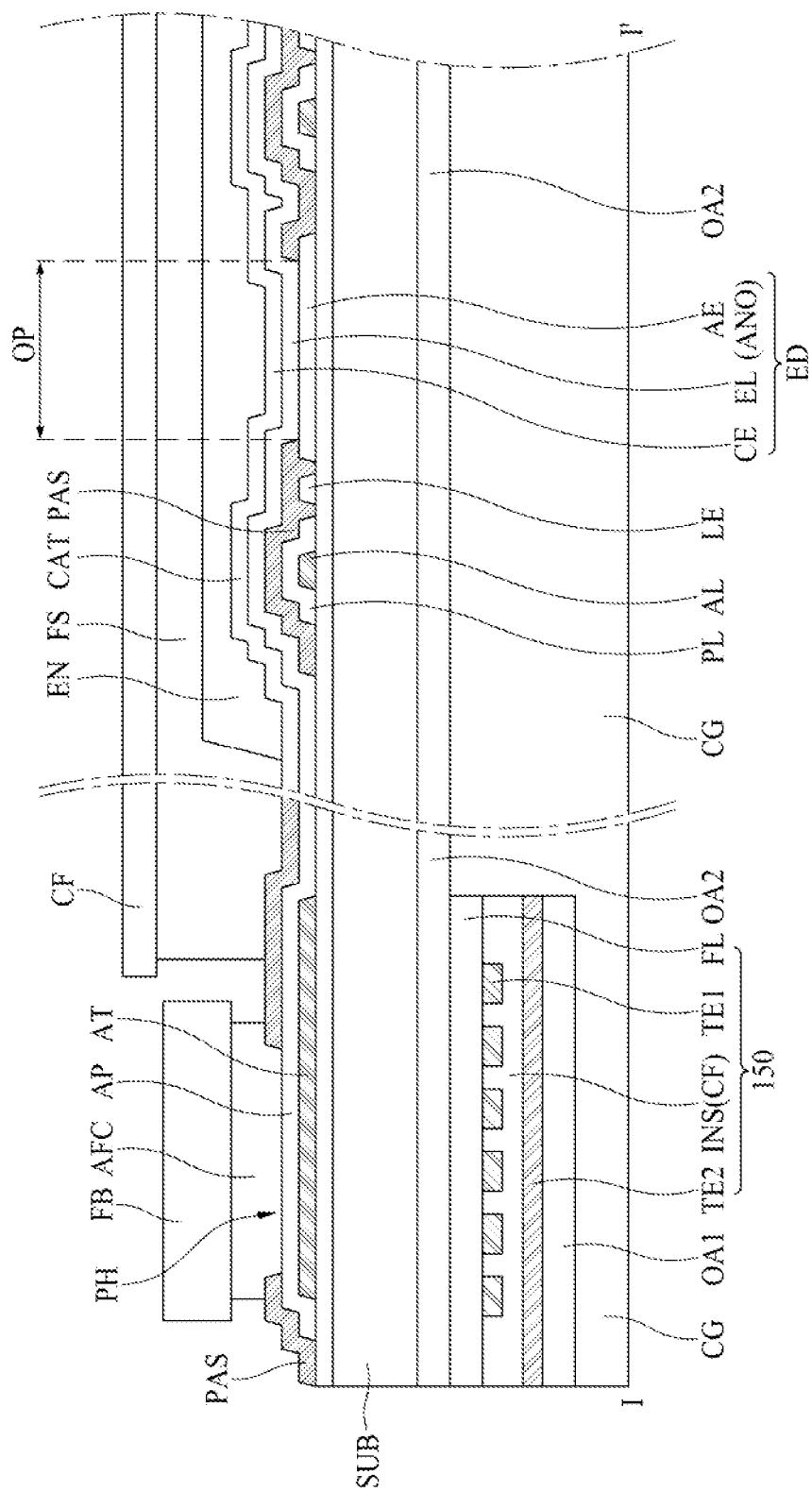
FIG. 4 is a cross-sectional view, taken along the cutting line I-I' of FIG. 1, illustrating a structure of the electroluminescent lighting device embedding a touch layer according to the third embodiment of the present disclosure.

Hereinafter, referring to FIGS. 1 and 4, the third embodiment of the present disclosure will be explained. FIG. 4 is a cross-sectional view, taken along the cutting line I-I' of FIG. 1, illustrating a structure of the electroluminescent lighting device embedding a touch layer according to the third embodiment of the present disclosure.

Referring to FIG. 4, the electroluminescent lighting device embedding a touch layer according to the third embodiment of the present disclosure comprises a substrate SUB, a routing line RT, an auxiliary line AL, an anode layer ANO, a cathode layer CAT, an emission element ED, a first pad AP, a second pad CP, a cover film CF and a touch layer 150. The basic structure of the electroluminescent lighting device embedding a touch layer according to the third embodiment is very similar with that of the first and the second embodiments. The difference is at the configuration and the location of the touch layer 150. Hereinafter, we will explain as focusing on the important features of the third embodiment. The numeric references shown in FIG. 4 but not explained may be referred to the first embodiment.

The touch layer 150 according to the third embodiment may include a film substrate FL, a first touch electrode TE1, an insulating layer INS and a second touch electrode TE2. There may be various methods for forming the touch layer 150 according to the third embodiment, but representative one example may be as follows.

The film substrate FL may be provided as having a shape and area corresponding to the first non-emission area IA1. As shown in FIG. 4, the first touch electrode TE1 is formed under the bottom surface of the film substrate FL. The insulating layer INS is deposited on the whole area of the bottom surface of the film substrate FL having the first touch electrode TE1. In some cases, the insulating layer INS may include a color filter CF having a specific color. For another example, the insulating layer INS may include a pigment having a specific color.

The second touch electrode TE2 is formed on the insulating layer INS. As the film substrate FL having the first touch electrode TE1 and the second touch electrode TE2 has the size corresponding to the first non-emission area IA1 of the substrate SUB, the touch layer 150 may have the area corresponding to the first non-emission area IA1.

Depositing a first optical adhesive OA1 on the bottom surface of the second touch electrode TE2, the film substrate FL is attached with the cover glass CG. After that, depositing a second optical adhesive OA2 on the upper surface of the film substrate FL and the cover glass CG, the film substrate FL and the cover glass CG are attached with the substrate SUB.

Fourth Embodiment

Figure 5:
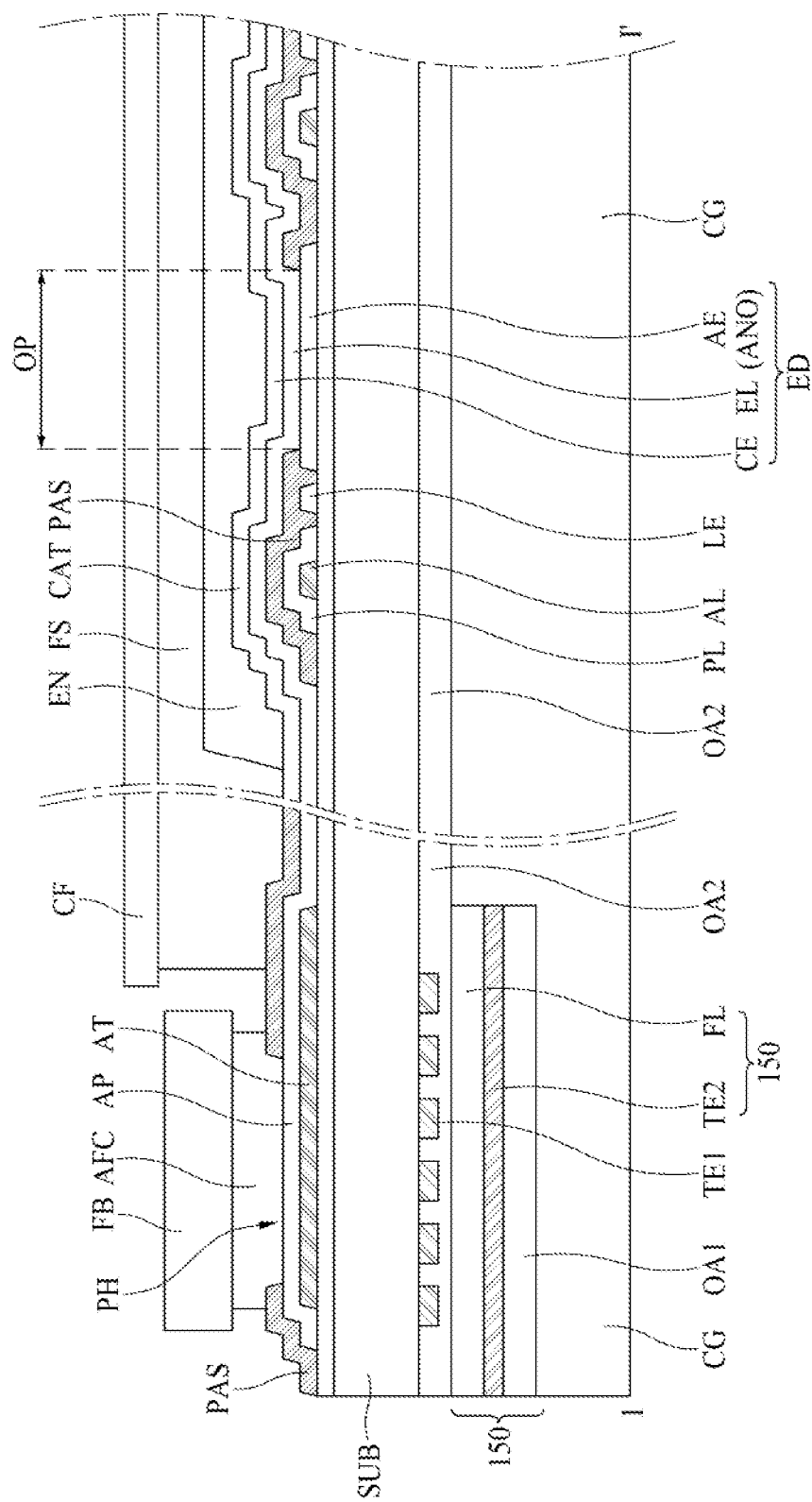
FIG. 5 is a cross-sectional view, taken along the cutting line I-I' of FIG. 1, illustrating a structure of the electroluminescent lighting device embedding a touch layer according to the fourth embodiment of the present disclosure.

Hereinafter, referring to FIGS. 1 and 5, we will explain about the fourth embodiment of the present disclosure. FIG. 5 is a cross-sectional view, taken along the cutting line I-I' of FIG. 1, illustrating a structure of the electroluminescent lighting device embedding a touch layer according to the fourth embodiment of the present disclosure.

Referring to FIG. 5, the electroluminescent lighting device embedding a touch layer according to the fourth embodiment of the present disclosure comprises a substrate SUB, a routing line RT, an auxiliary line AL, an anode layer ANO, a cathode layer CAT, an emission element ED, a first pad AP, a second pad CP, a cover film CF, a first touch electrode TE1 and a touch layer 150. The basic structure of the electroluminescent lighting device embedding a touch layer according to the fourth embodiment is very similar with that of the first to the third embodiments. The difference is at the configuration and the location of the touch layer 150. Hereinafter, we will explain as focusing on the impor- tant features of the fourth embodiment. The numeric references shown in FIG. 5 but not explained may be referred to the first embodiment.

There may be various methods for forming the touch layer 150 according to the fourth embodiment, but representative one example may be as follows. The electroluminescent lighting device embedding a touch layer according to the fourth embodiment has a feature in which the first touch electrode TE1 is formed on the bottom surface of the substrate SUB at first. In addition, the touch layer 150 according to the fourth embodiment may include the film substrate FL and the second touch electrode TE2.

The film substrate FL may be provided as having a shape and area corresponding to the first non-emission area IA1. As shown in FIG. 5, the second touch electrode TE2 is formed under the bottom surface of the film substrate FL. Depositing a first optical adhesive OA1 on the bottom surface of the film substrate FL having the second touch electrode TE2, the film substrate FL is attached with the cover glass CG. Here, the second touch electrode TE2 may be disposed at the area corresponding to the first non-emission area IA1 of the substrate SUB.

Depositing a second optical adhesive OA2 on the whole bottom surface of the substrate SUB having the first touch electrode TE1, the film substrate FL and the substrate SUB are attached each other in face.

The electroluminescent lighting device according to the present disclosure explained above includes the touch elements at the non-emission area of the lighting device. The touch sensor may include any one type of the resistance sensitive type, the capacitance sensitive type and/or the force sensitive type.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent lighting device, comprising:
   a substrate including an emission area and a non-emission area surrounding the emission area;
   an emission element on a first surface of the substrate in the emission area;
   a first pad and a second pad on the first surface of the substrate in the non-emission area;
   a touch layer on a second surface of the substrate opposite the first surface; and
   a cover plate attached on a surface of the touch layer opposite the second surface of the substrate.

2. The device according to claim 1, wherein the touch layer includes:
   a touch electrode including a transparent conductive material, the touch electrode on the second surface of the substrate.

3. The device according to claim 1, wherein the touch layer includes:

a first touch electrode on the second surface of the substrate in the non-emission area;
an insulation layer covering the first touch electrode; and
a second touch electrode overlapping with the first touch electrode on the insulation layer.

4. The device according to claim 3, wherein the insulation layer includes at least one of a pigment or a color filter representing a specific color.

5. The device according to claim 1, wherein the touch layer is attached to the cover plate with a first optical adhesive layer.

6. The device according to claim 5, wherein the touch layer is attached to the second surface of the substrate with a second optical adhesive layer.

7. The device according to claim 1, wherein the touch layer is disposed in the non-emission area, and the first pad and the second pad overlap the touch layer in the non-emission area.

8. The device according to claim 7, wherein the touch layer and the cover plate are attached to the second surface of the substrate with a first optical adhesive layer.

9. The device according to claim 1, further comprising:
a first touch electrode on the second surface of the substrate, the first touch electrode overlapped by the first pad and the second pad,
wherein the touch layer includes:
a film layer; and
a second touch electrode on the film layer, the film layer disposed between the first touch electrode and the second touch electrode,
wherein the touch layer is attached to the cover plate in the non-emission area with a first optical adhesive layer, and
wherein the touch layer and the cover plate are attached to the first touch electrode and the substrate with a second optical adhesive layer.

10. The device according to claim 1, further comprising:
an encapsulation layer covering the emission area;
a cover film covering the substrate on the encapsulation layer and exposing the first pad and the second pad; and
an adhesive layer attaching the cover film with the encapsulation layer.

* * * * *